US010032738B2

(12) United States Patent
Park et al.

(10) Patent No.: US 10,032,738 B2
(45) Date of Patent: Jul. 24, 2018

(54) METHOD FOR FORMING BUMP OF SEMICONDUCTOR PACKAGE

(71) Applicants: SMART MODULAR TECHNOLOGIES LX S.A.R.L, Seongnam-si, Gyeonggi-do (KR); Bum Wook Park, Seoul (KR); Hyun Jung, Seoul (KR)

(72) Inventors: Bum Wook Park, Seoul (KR); Hyun Jung, Seoul (KR)

(73) Assignee: SMART MODULAR TECHNOLOGIES LX S.A.R.L., Seongnam-si, Gyeonggi-do (KR)

(*) Notice: Subject to any disclaimer, the term of this patent is extended or adjusted under 35 U.S.C. 154(b) by 0 days.

(21) Appl. No.: 15/629,234

(22) Filed: Jun. 21, 2017

(65) Prior Publication Data

US 2018/0174990 A1 Jun. 21, 2018

(30) Foreign Application Priority Data

Dec. 15, 2016 (KR) .................. 10-2016-0171482

(51) Int. Cl.
*H01L 23/00* (2006.01)
(52) U.S. Cl.
CPC ..... *H01L 24/11* (2013.01); *H01L 2224/11462* (2013.01); *H01L 2224/1401* (2013.01); *H01L 2224/14517* (2013.01); *H01L 2924/014* (2013.01); *H01L 2924/01029* (2013.01)
(58) Field of Classification Search
CPC ........................................ H01L 24/11
See application file for complete search history.

(56) References Cited

U.S. PATENT DOCUMENTS

| 6,117,299 A | 9/2000 | Rinne et al. |
| 7,586,200 B2 * | 9/2009 | Wang ............... H01L 24/03 257/431 |
| 8,546,254 B2 * | 10/2013 | Lu ............... C25D 5/10 257/E21.479 |
| 2007/0182004 A1 * | 8/2007 | Rinne ............... H01L 23/3114 257/734 |

FOREIGN PATENT DOCUMENTS

| KR | 1020040065158 A | 7/2004 |
| KR | 10-0536927 B1 | 12/2005 |
| KR | 10-0850212 B1 | 8/2008 |
| KR | 1020090075883 A | 7/2009 |
| KR | 1020140029101 A | 3/2014 |
| KR | 1020160004065 A | 1/2016 |

* cited by examiner

*Primary Examiner* — Karen Kusumakar
(74) *Attorney, Agent, or Firm* — Ladas & Parry LLP (57) ABSTRACT

The present invention provides a method for forming bumps of a semiconductor package to suppress a final height difference between main bumps and support bumps that is caused by a height difference between areas of an underlying layer when viewed on a cross-section. The method may include forming first seed layer patterns and second seed layer patterns which are disposed in the areas and are separated from each other, over the underlying layer having the height difference. The method may include forming the main bumps and the support bumps of which final heights are the same when viewed on the cross-section in the areas, by performing electroplating through using, as electrodes, the first seed layer patterns and the second seed layer patterns which are disposed in the areas and are separated from each other, under different conditions in the areas.

13 Claims, 13 Drawing Sheets

METHOD FOR FORMING BUMP OF SEMICONDUCTOR PACKAGE

CROSS-REFERENCE TO RELATED APPLICATION

The present application claims priority to Korean Patent Application No. 10-2016-0171482 filed on Dec. 15, 2016, in the Korean Intellectual Property Office, which is incorporated herein by reference in its entirety.

BACKGROUND

1. Technical Field

The present invention generally relate to a method for manufacturing a semiconductor package, and more particularly, to a method for forming bumps of a semiconductor package for flip-chip bonding.

2. Related Art

With the development of the information communication and digital technologies, demands for new materials, semiconductor parts and modules, and substrates which are used in high frequency regions and have high data processing speeds are increasing. Also, according to trends toward the miniaturization, multiple bands and high frequency of mobile communication terminals, the high frequency, high degree of integration and miniaturization of semiconductor parts are being demanded.

Key technologies capable of satisfying such demands may include electrical connection technologies. Electrical connection technologies may include wire bonding using metal wires, connection using anisotropic conductive films, flip-chip bonding using bumps, and thermal compression bonding using micro bumps.

Among these electrical connection technologies, in the flip-chip bonding and thermal compression bonding technologies, a semiconductor chip is bonded to a printed circuit board in a face-down type by using bumps. Bumps used therefor may include C4 (controlled collapse chip connection) bumps, C2 (chip connection) bumps, Au bumps for tape automated bonding (TAB), bumps mounted with solder balls, and Au stud bumps.

The C2 bumps are usually referred to as Cu pillar bumps, and may be divided into general bumps and micro bumps depending on a pitch and a size. The flip-chip bonding technology using bumps may enable high speed data transmission by decreasing an impedance through shortening an electrical connection length between a semiconductor chip and an external circuit. Therefore, the flip-chip bonding technology using bumps is generally applied to communication devices and memory devices which operate at high speeds.

Hereinbelow, a method for forming bumps of a semiconductor package according to the conventional art will be schematically described with reference to FIGS. 1A to 1E.

Figure 1A:
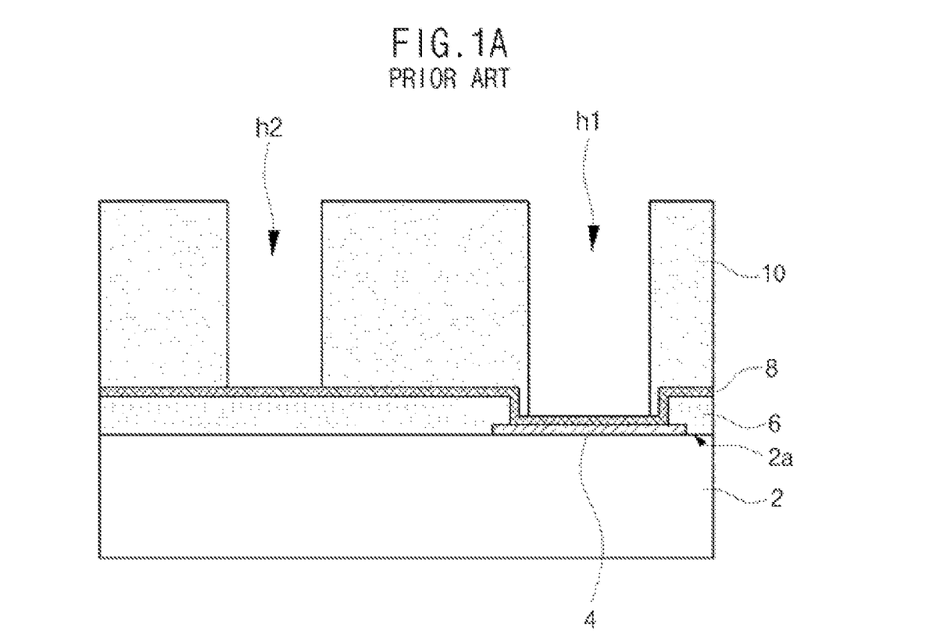
FIGS. 1A to 1E are representations of examples of cross-sectional views by processes to assist in the explanation of a method for forming bumps of a semiconductor package according to the conventional art.

Referring to FIG. 1A, a semiconductor chip 2 in which an integrated circuit is formed is prepared. The semiconductor chip 2 may include an electrode pad 4 which is disposed on a top surface 2a thereof. Also, the semiconductor chip 2 may include an insulation layer 6 which is formed over the entire area of the top surface 2a in such a way as to expose the electrode pad 4. A seed layer 8 is formed on the electrode pad 4 and the insulation layer 6 which are exposed. The seed layer 8 is formed over the entire area of the semiconductor chip 2. Then, a photoresist pattern 10 having first and second holes h1 and h2 which expose portions of the seed layer 8 on which bumps are to be formed is formed on the seed layer 8. The photoresist pattern 10 is formed to have the first hole h1 which exposes the portion of the seed layer 8 on which a main bump for flip-chip bonding of the semiconductor chip 2 is to be formed and the second hole h2 which exposes the portion of the seed layer 8 on which a support bump for preventing leaning of the semiconductor chip 2 in flip-chip bonding of the semiconductor chip 2 is to be formed.

Figure 1B:
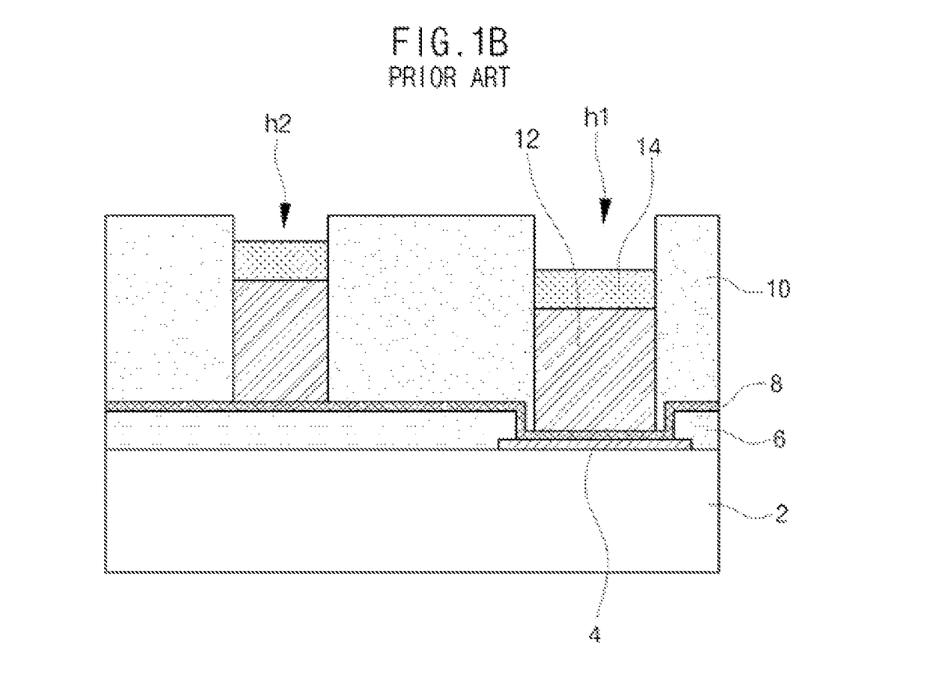

Referring to FIG. 1B, by performing copper electroplating using the seed layer 8, copper pillars 12 are formed in the first hole h1 and the second hole h2, respectively. Then, a solder 14 is formed in the first hole h1 and the second hole h2 which are formed with the copper pillars 12.

Figure 1C:
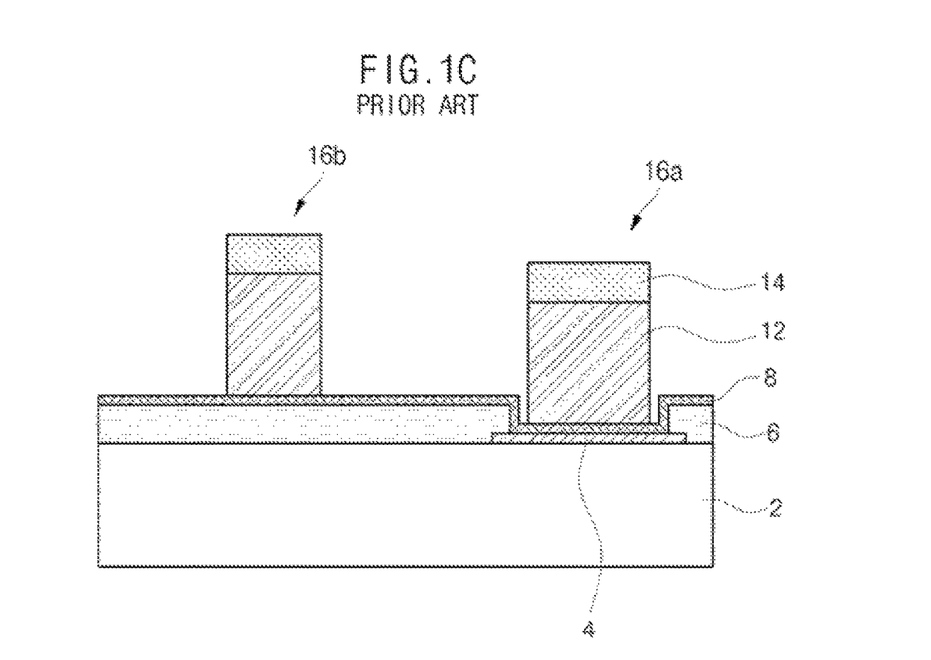

Referring to FIG. 1C, the photoresist pattern 10 is removed. As a result of this, a first stack 16a of the copper pillar 12 and the solder 14 remains on the portion of the seed layer 8 on the electrode pad 4 on which the main bump is to be formed, and a second stack 16b of the copper pillar 12 and the solder 14 remains on the portion of the seed layer 8 on which the support bump is to be formed.

Figure 1D:
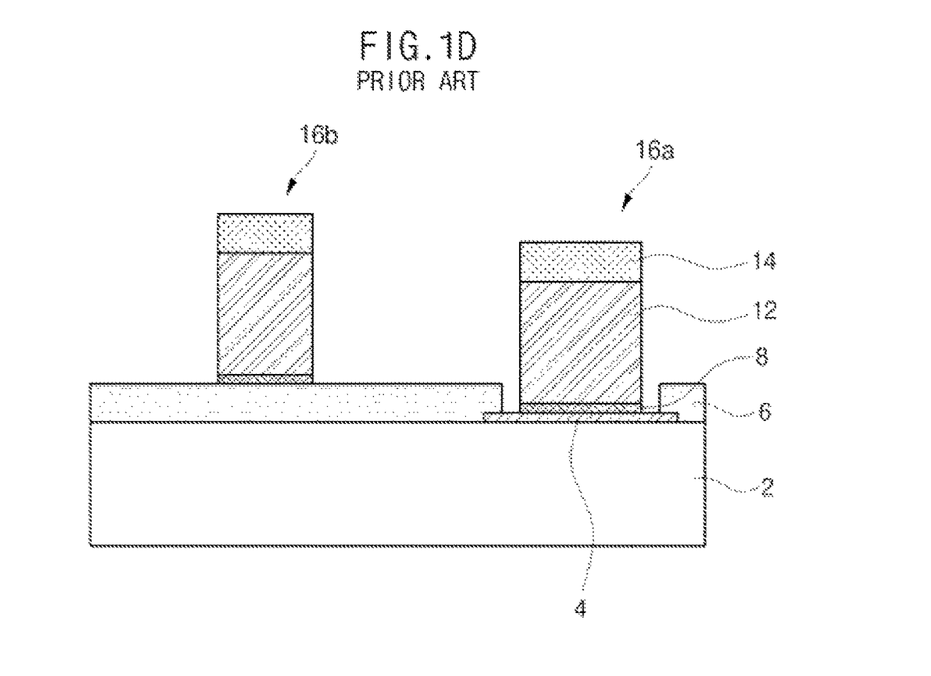

Referring to FIG. 1D, by performing an etching process using the first stack 16a and the second stack 16b as an etch mask, exposed portions of the seed layer 8 are removed.

Figure 1E:
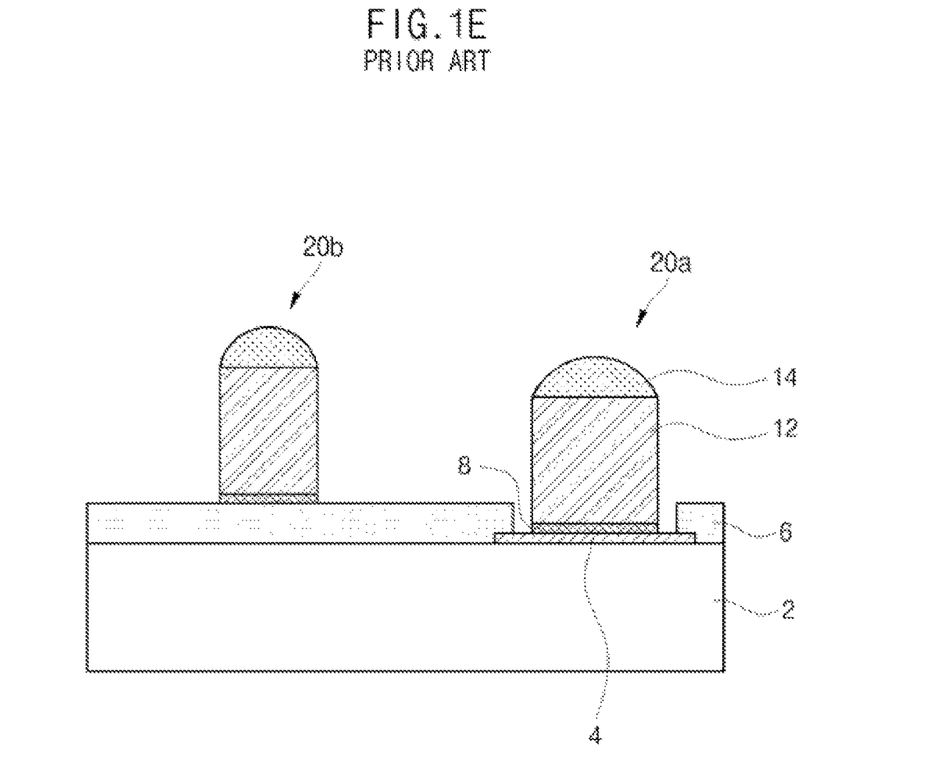

Referring to FIG. 1E, by performing a high temperature process, the solder 14 is formed to have a spherical or hemispherical shape. As a result of this, a main bump 20a for flip-chip bonding of the semiconductor chip 2 is formed on the electrode pad 4, and a support bump 20b for preventing leaning of the semiconductor chip 2 in flip-chip bonding of the semiconductor chip 2 is formed at the periphery of the semiconductor chip 2.

While not shown, semiconductor chips of a wafer state which are completely formed with bumps in this way are separated into individual semiconductor chips through a wafer sawing process. Thereafter, each semiconductor chip is flip-chip bonded to a printed circuit board.

However, in the conventional art for forming bumps, a difference exists in the final heights of the bumps due to a difference in the heights of an underlying layer. Owing to this fact, when flip-chip bonding a semiconductor chip, as a main bump is not brought into contact with a bond finger of a printed circuit board, an electrical connection may not be appropriately formed, and a physical coupling force between the semiconductor chip and the printed circuit board may decrease.

Figure 2:
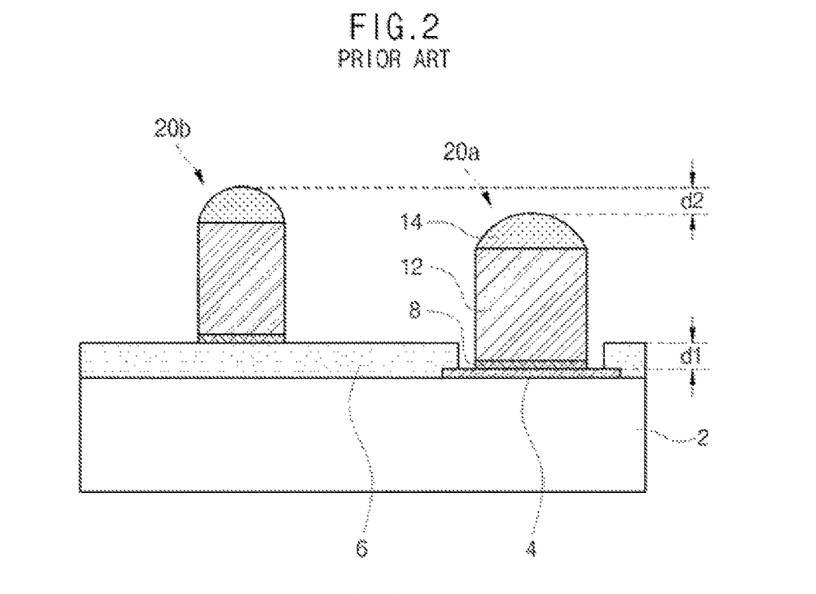
FIGS. 2 to 4 are representations of examples of cross-sectional views to assist in the explanation of problems of the conventional art.

In detail, FIG. 2 is a cross-sectional view illustrating a representation of an example of a difference existing between the final heights of bumps due to non-uniformity in the heights of layers lying under the bumps.

As shown, since the electrode pad 4 is disposed at the center portion of the semiconductor chip 2, the main bump 20a is positioned on the electrode pad 4 at the center portion of the semiconductor chip 2. Conversely, the support bump 20b for preventing leaning of the semiconductor chip 2 in flip-chip bonding is positioned on the insulation layer 6 at the periphery of the semiconductor chip 2.

Because a height difference d1 exists between the electrode pad 4 and the insulation layer 6, when assuming that the thicknesses of the copper pillars 12 and the solder 14 formed at the center portion and the periphery of the semiconductor chip 2 are the same, a height difference d2 exists as well between the main bump 20a and the support bump 20b. In general, since the thickness of the insulation layer 6 is approximately 3 to 10 μm and the thickness of the electrode pad 4 is substantially thin when compared to the thickness of the insulation layer 6, a height difference by approximately the thickness of the insulation layer 6 exists between the main bump 20a and the support bump 20b.

Figure 3:
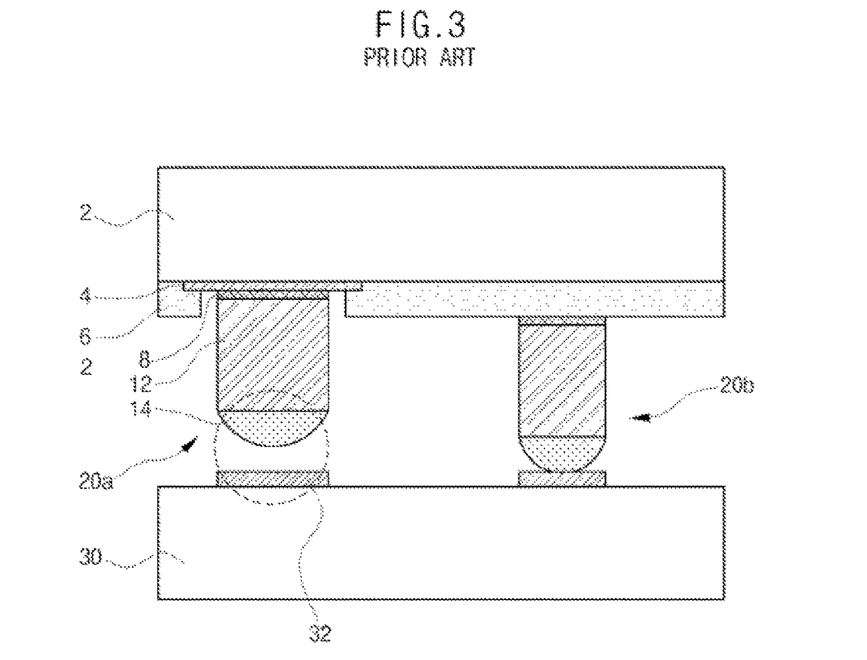

Therefore, in the case of performing flip-chip bonding by using the bumps 20a and 20b which have a final height difference as described above, as shown in FIG. 3, the main bump 20a formed on the electrode pad 4 may not be bonded with a bond finger 32 of a printed circuit board 30.

Meanwhile, in the conventional art, in order to solve the problem caused by such a height difference between bumps, a chemical mechanical polishing (CMP) process is utilized to make the final heights of the bumps uniform.

Figure 4:
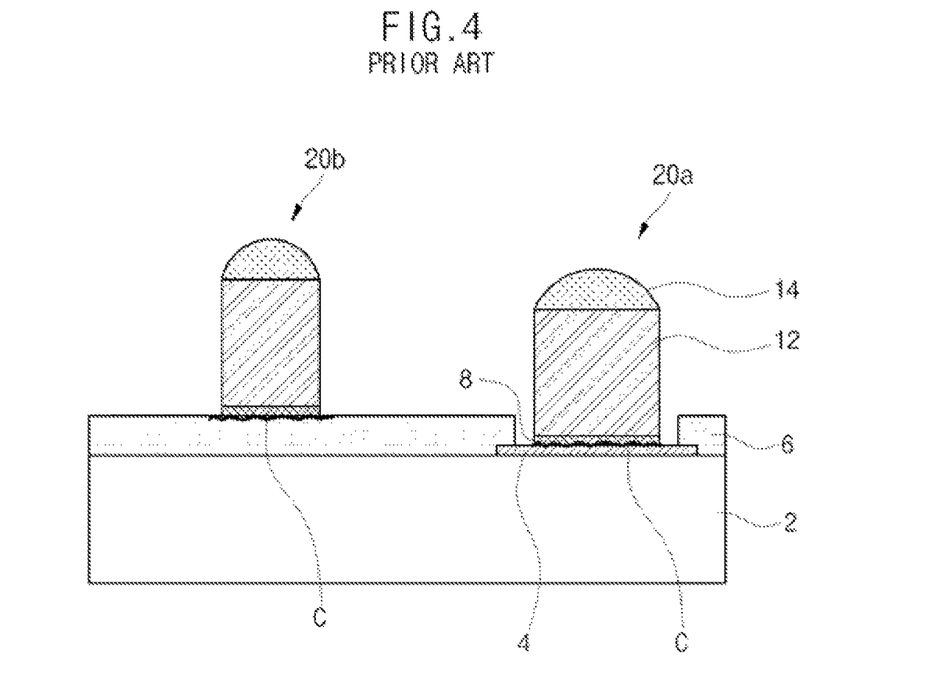

However, if the CMP process is utilized, as shown in FIG. 4, as mechanical stresses are applied to the bumps 20a and 20b, cracks C may occur between the bumps 20a and 20b and the semiconductor chip 2. Due to the crack C, electrical connection between the semiconductor chip 2 and the printed circuit board 30 by the main bump 20a may be released or contact resistance therebetween may increase. Furthermore, if the support bump 20b is decoupled due to the crack C, the physical coupling force between the semiconductor chip 2 and the printed circuit board 30 decreases, and the balance of the semiconductor chip 2 may be broken.

SUMMARY

In an embodiment, there is provided a method for forming bumps of a semiconductor package to suppress a final height difference between main bumps and support bumps that is caused by a height difference between areas of an underlying layer when viewed on a cross-section. The method may include forming first seed layer patterns and second seed layer patterns which are disposed in the areas and are separated from each other, over the underlying layer having the height difference. The method may include forming the main bumps and the support bumps of which final heights are the same when viewed on the cross-section in the areas, by performing electroplating through using, as electrodes, the first seed layer patterns and the second seed layer patterns which are disposed in the areas and are separated from each other, under different conditions in the areas.

DETAILED DESCRIPTION

Various embodiments may provide a method for forming bumps of a semiconductor package, capable of controlling the final heights of the bumps to be uniform, while not decreasing a bonding force between the semiconductor chip and the bumps. Also, various embodiments may provide a method for forming bumps of a semiconductor package, capable of securing bonding reliability in flip-chip bonding of the semiconductor chip by uniformizing the final heights of the bumps even with a height difference of layers lying under the bumps.

Hereinafter, a method for forming bumps in a semiconductor package will be described below with reference to the accompanying drawings through various examples of embodiments.

FIGS. 5A to 5I are representations of examples of cross-sectional views by processes to assist in the explanation of a method for forming bumps of a semiconductor package in accordance with an embodiment.

Figure 5A:
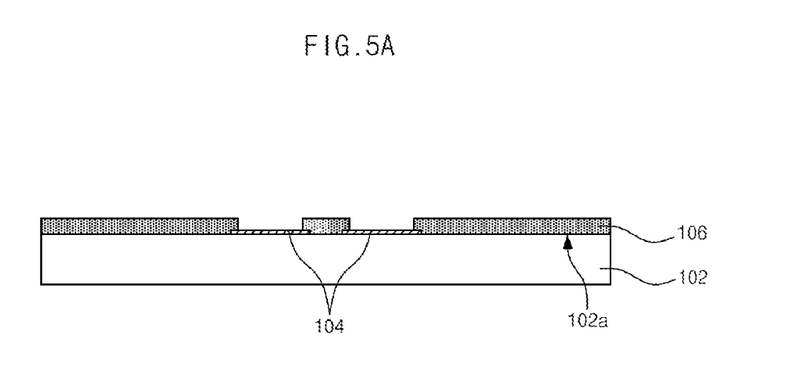
FIGS. 5A to 5I are representations of examples of cross-sectional views by processes to assist in the explanation of a method for forming bumps of a semiconductor package in accordance with an embodiment of the present invention.

Referring to FIG. 5A, a semiconductor chip 102 in which an integrated circuit is formed is prepared. The semiconductor chip 102 may include all kinds of semiconductor chips, for example, a memory chip, a logic chip, a DDI (display driver IC) and a CMOS image sensor chip. In the present embodiment, the semiconductor chip 102 may be a memory chip, in particular, a DRAM chip.

While not shown, the semiconductor chip 102 may include multi-layered metal lines which are formed therein. Also, the semiconductor chip 102 may include electrode pads 104 which are arranged on a top surface 102a thereof. The electrode pads 104 are for electrical connection with an external circuit. For example, the electrode pads 104 may be arranged in 2 lines at the center portion of the top surface 102a of the semiconductor chip 102.

The semiconductor chip 102 may include an insulation layer 106 which is formed over the entire area of the top surface 102a thereof in such a way as to expose the electrode pads 104. The insulation layer 106 is formed for protecting a circuit formed in the semiconductor chip 102, from external influences, and for electrical insulation from an exterior. The insulation layer 106 may include an organic layer such as polyimide and/or an inorganic layer such as a silicon nitride layer, and may be formed to a thickness of approximately 3 to 10 μm. The insulation layer 106 may perform also the function of a stress buffer layer (SBL).

Meanwhile, the semiconductor chip 102 in accordance with the embodiment may be understood as being prepared at a wafer level, and the electrode pads 104 may be understood as being individually connected with uppermost metal lines among the multi-layered metal lines formed in the semiconductor chip 102.

Figure 5B:
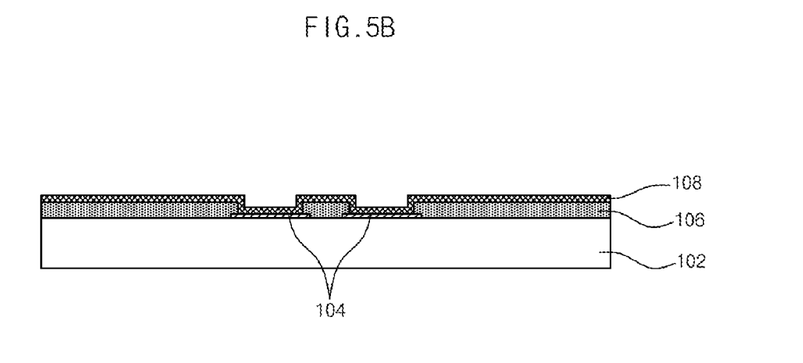

Referring to FIG. 5B, a seed layer 108 is formed on the exposed electrode pads 104 and the insulation layer 106 by using a PVD (physical vapor deposition) process. The seed layer 108 is formed over the entire area of the semiconductor chip 102 which is prepared at a wafer level.

The seed layer 108 may also be referred to as a UBM (under bump metallization), and may be divided into a bonding layer for increasing a bonding force and an electrode layer for electroplating. In an embodiment, the seed layer 108 may be formed to a thickness of approximately 300 to 1,000 nm.

Figure 5C:
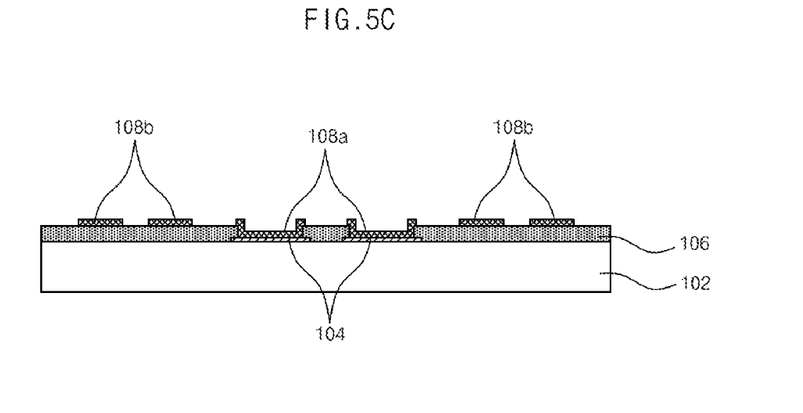

Referring to FIG. 5C, the seed layer 108 is patterned by using a photolithography process, and through this, first seed layer patterns 108a which are disposed on the electrode pads 104 and second seed layer patterns 108b which are disposed at the peripheries of the semiconductor chip 102 are formed.

The pattering of the seed layer 108 is to electrically isolate portions of the seed layer 108 which are disposed where main bumps are to be formed and portions of the seed layer 108 which are disposed where support bumps are to be formed. The portions of the seed layer 108 are formed not in the shape of islands which are disposed at areas where the main bumps and support bumps are to be formed, but are formed to be disposed at main bump forming areas, areas between the main bump forming areas, support bump forming areas, and areas between the support bump forming areas.

Figure 6A:
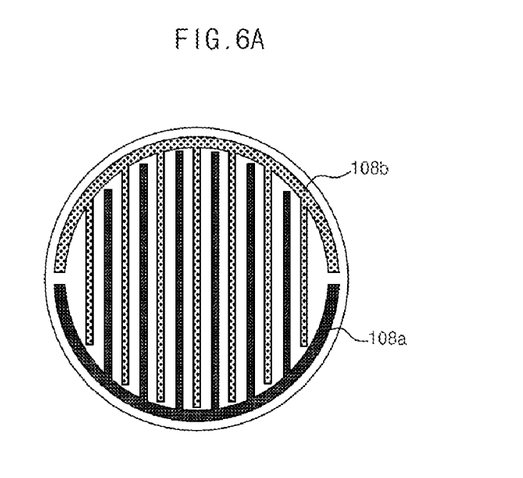
FIGS. 6A and 6B are plan views illustrating representations of examples of the shapes of seed layer patterns in the method for forming bumps of a semiconductor package in accordance with the embodiment of the present invention.
Figure 6B:
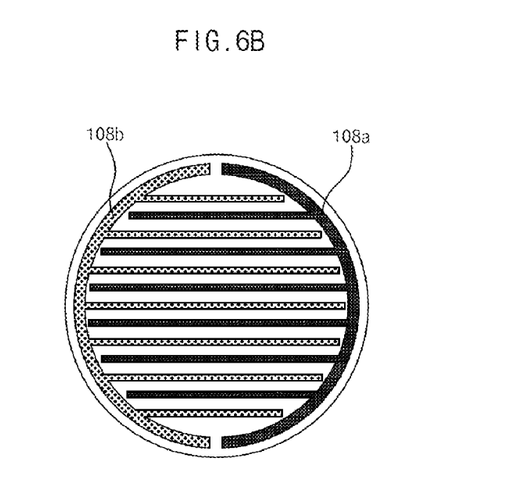

In an embodiment, as shown in FIGS. 6A and 6B, the first seed layer patterns 108a and the second seed layer patterns 108b may be formed in the shapes of lines which extend in a vertical direction and are alternately disposed in a horizontal direction or may be formed in the shapes of lines which extend in the horizontal direction and are alternately disposed in the vertical direction. In order for easy application of electric fields in electroplating, the lower or right ends of the first seed layer patterns 108a and the upper or left ends of the second seed layer patterns 108b may be formed to be connected with one another.

Figure 7A:
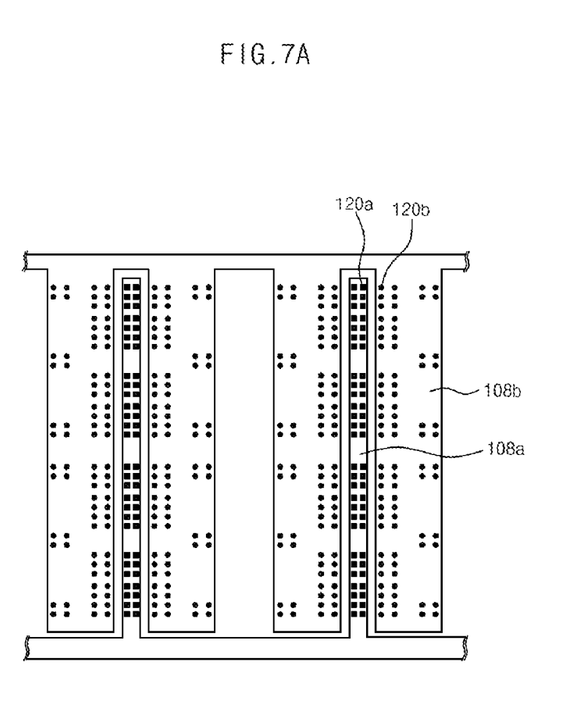
FIGS. 7A and 7B are representations of examples of enlarged plan views to assist in the explanation of the shapes of seed layer patterns in the method for forming bumps of a semiconductor package in accordance with the embodiment of the present invention.

FIG. 7A is a representation of an example of an enlarged plan view to assist in the detailed explanation of the first and second seed layer patterns 108a and 108b. As shown, the first seed layer patterns 108a and the second seed layer patterns 108b may be formed in the shapes of lines which extend in the vertical direction and are alternately disposed in the horizontal direction. The second seed layer patterns 108b may be formed to have a width relatively wider than the first seed layer patterns 108a in consideration of the number and positions of support bumps to be formed. The lower ends of the first seed layer patterns 108a may be connected with one another, and the upper ends of the second seed layer patterns 108b may be connected with one another.

Figure 7B:
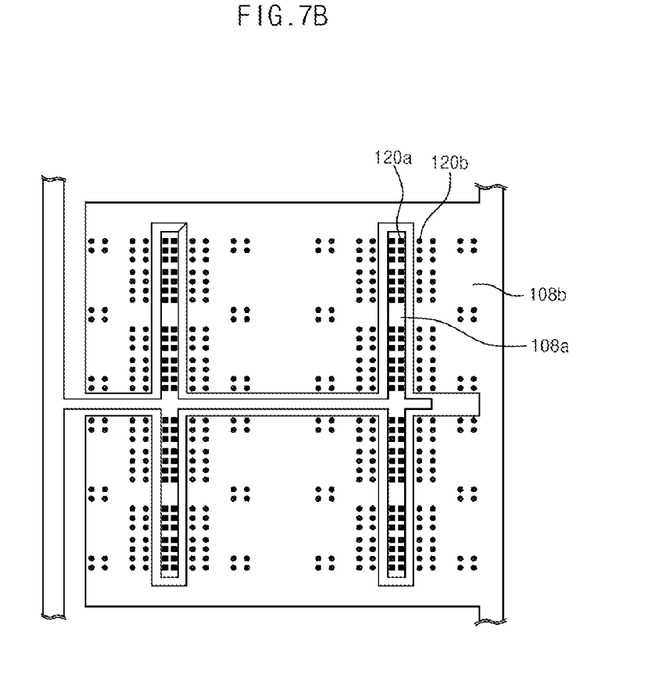

In another embodiment, the first seed layer patterns 108a and the second seed layer patterns 108b may be formed by mixing line and plate shapes. That is to say, as shown in FIG. 7B, the first seed layer patterns 108a may be formed in the shapes of lines each of which extends in the horizontal direction and includes, at intermediate portions thereof, branch portions extending in the vertical direction, and the second seed layer patterns 108b may be formed in the shapes of plates which surround the first seed layer patterns 108a. While not shown clearly, the first seed layer patterns 108a may be formed such that left ends thereof are connected with one another, and the second seed layer patterns 108b may be formed such that right ends thereof are connected with one another.

In FIGS. 7A and 7B, the reference symbol 120a designates main bumps and the reference symbol 120b designates support bumps.

Meanwhile, although not shown, forming of the first and second seed layer patterns 108a and 108b may be performed not by a photolithography process but by using a shadow metal mask. In this case, after disposing, on the insulation layer 106 including the electrode pads 104, a shadow metal mask having a structure which separately exposes main bump forming areas on the electrode pads 104, portions of the insulation layer 106 therebetween, support bump forming areas at the peripheries of the semiconductor chip 102 and portions of the insulation layer 106 therebetween, a selective seed layer deposition process for the exposed areas is performed by using the shadow metal mask as a deposition mask, and then, the shadow metal mask may be removed. In the deposition process using the shadow metal mask, a poor deposition may occur as the shadow metal mask and the semiconductor chip 102 of the wafer level are separated from each other. In this case, the problem caused due to separation of the shadow metal mask may be solved by using a magnetic material.

Figure 5D:
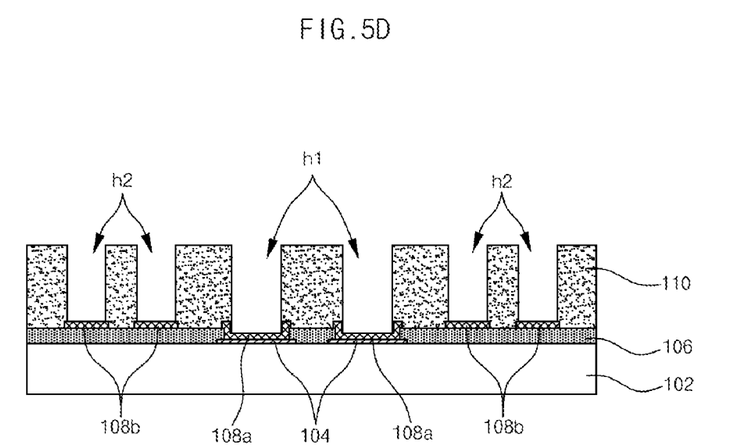

Referring to FIG. 5D, after applying a photoresist on the insulation layer 106 of the semiconductor chip 102 including the first and second seed layer patterns 108a and 108b, by exposure and development of the photoresist, a photoresist pattern 110 having first holes h1 which respectively expose portions of the first seed layer patterns 108a where main bumps are to be formed and second holes h2 which respectively expose portions of the second seed layer patterns 108b where support bumps are to be formed is formed. The photoresist may be used by appropriately selecting a positive type or a negative type depending on the height and size of bumps to be formed.

Figure 5E:
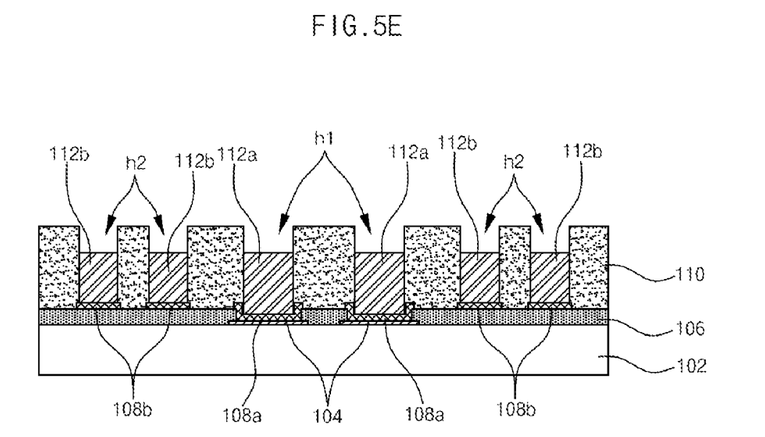

Referring to FIG. 5E, by performing electroplating through using the first and second seed layer patterns 108a and 108b as electrode terminals, first copper pillars 112a are formed in the first holes h1, and second copper pillars 112b are formed in the second holes h2. In this regard, by differentiating voltages, currents and times applied to the first seed layer patterns 108a and the second seed layer patterns 108b, a copper plating amount in the first hole h1 and a copper plating amount in the second hole h2 are differentiated, and through this, a height difference between the first copper pillar 112a and the second copper pillar 112b is removed.

In detail, a plating amount, that is, a plating height, in electroplating may be determined generally by a current density, the temperature of a plating solution, a hydrogen ion concentration exponent, a mixed state, an electroplating solution and a time. In the embodiment, because the first seed layer patterns 108a for formation of main bumps and the second seed layer patterns 108b for formation of support bumps are put into the same bath, it seems that conditions such as a temperature, a hydrogen ion concentration exponent, a mixed state and an electroplating solution are the same. Conversely, because the first seed layer patterns 108a and the second seed layer patterns 108b are separated from each other, current densities and plating times may be applied differently.

Therefore, in order to increase the plating height of main bumps which are placed at lower positions when viewed on a cross-section, by increasing the density of current applied to the first seed layer patterns 108a to be larger than the density of current applied to the second seed layer patterns 108b or lengthening a plating time with respect to the first seed layer patterns 108a to be longer than a plating time with respect to the second seed layer patterns 108b, the height of the second copper pillar 112b formed in the second hole h2 may become lower than the height of the first copper pillar 112a formed in the first hole h1. As a result, when viewed on a cross-section, the first copper pillar 112a and the second copper pillar 112b may not have a height difference and may have the same height.

For example, when assuming that the thickness of the insulation layer 106 is 5 μm and conditions for plating copper to the thickness of 40 μm include current of 1.2 A and time of 25 minutes, the first copper pillars 112a may be formed to the thickness of 40 μm by performing plating for 25 minutes while applying current of 1.2 A to the first seed layer patterns 108a in order for forming main bumps, and the second copper pillars 112b may be formed to the thickness of 35 μm by performing plating for 25 minutes while applying current of 1.0 A to the second seed layer patterns 108b or performing plating for only 22 minutes while applying current of 1.2 A.

In this case, while it is the norm that the final heights of main bumps and support bumps after plating have the difference of approximately 5 μm, in the embodiment of the present disclosure, because the thickness of the second copper pillars 112b is decreased by approximately 5 μm when compared to the thickness of the first copper pillars 112a, a difference between the final heights of the main bumps and the support bumps corresponding to the thickness of the insulation layer 106 is removed, and as a result, the main bumps and the support bumps may have the same height when viewed on a cross-section.

Figure 5F:
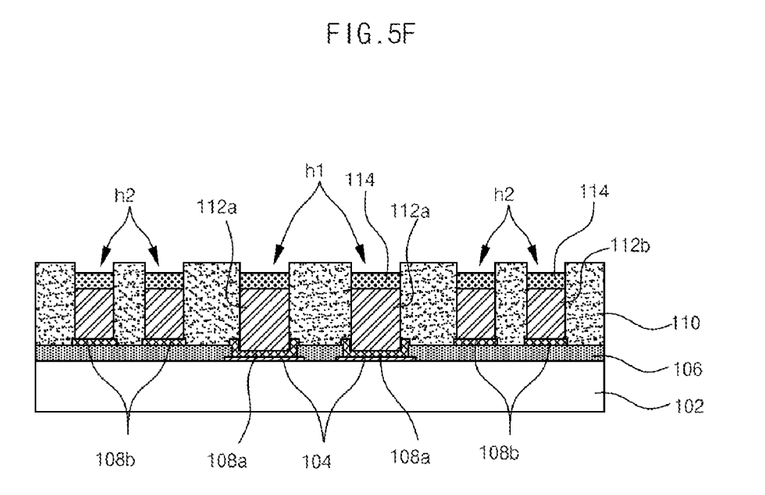

Referring to FIG. 5F, through a plating process, a solder 114 is formed on the first copper pillars 112a in the first holes h1 and the second copper pillars 112b in the second holes h2.

The formation of the solder 114, in particular, the formation of the solder 114 on the first copper pillars 112a is for stable bonding of the semiconductor chip 102 with a printed circuit board in flip-chip bonding of the semiconductor chip 102. In particular, in a manner similar to the case of the first and second copper pillars 112a and 112b, the solder 114 may be formed to have the same plating thickness or different plating thicknesses by controlling the densities of current applied to the first seed layer patterns 108a and the second seed layer patterns 108b or controlling plating times. In the present embodiment, since the first copper pillars 112a and the second copper pillars 112b have the same height when viewed on a cross-section, by differentiating the plating thicknesses of the first copper pillars 112a and the second copper pillars 112b, the solder 114 on the first copper pillars 112a and the second copper pillars 112b is plated to the same thickness.

The solder 114 is plated to a thickness of a range that does not completely fill the first holes h1 and the second holes h2.

Figure 5G:
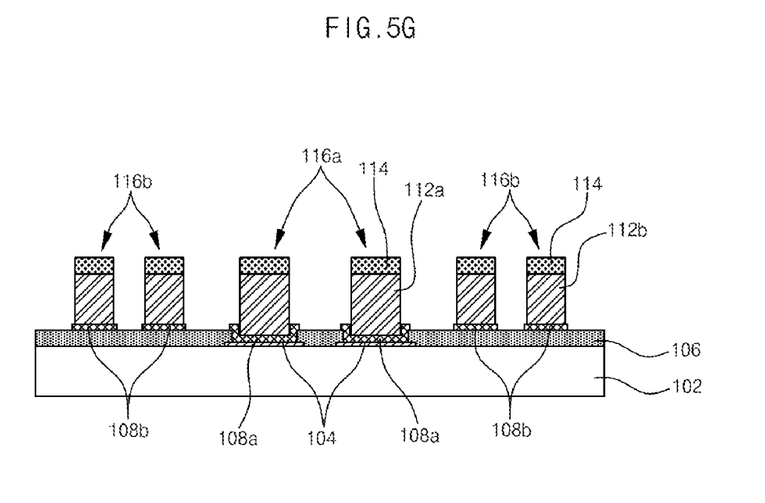

Referring to FIG. 5G, by removing the photoresist pattern 110 through oxygen ashing or a wet process using a photoresist stripper, first stacks 116a of the first copper pillars 112a and the solder 114 remain on portions of the first seed layer patterns 108a on the electrode pads 104 where main bumps are to be formed, and second stacks 116b of the second copper pillars 112b and the solder 114 remain on portions of the second seed layer patterns 108b where support bumps are to be formed.

Figure 5H:
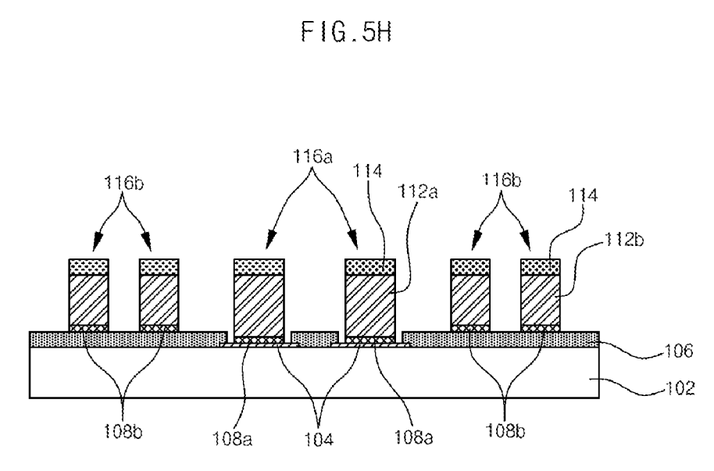

Referring to FIG. 5H, by performing a chemical etching process using the first stacks 116a and the second stacks 116b as an etch mask, remaining portions of the first and second seed layer patterns 108a and 108b excluding portions of the first and second seed layer patterns 108a and 108b which lie under the first stacks 116a and the second stacks 116b are removed.

Figure 5I:
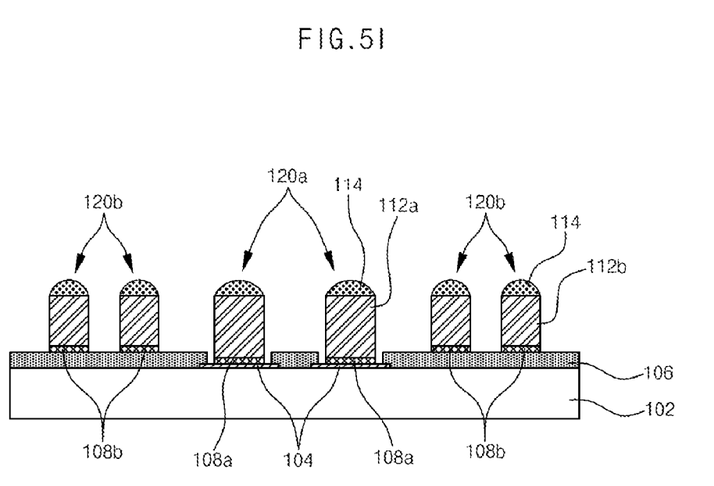

Referring to FIG. 5I, by performing a high temperature process, that is, a reflow process, for the solder 114, the solder 114 is formed to have a spherical or hemispherical shape. As a result of this, main bumps 120a for flip-chip bonding of the semiconductor chip 102 are formed on the electrode pads 104 of the semiconductor chip 102, and support bumps 120b for preventing leaning of the semiconductor chip 102 in flip-chip bonding of the semiconductor chip 102 are formed at the peripheries of the semiconductor chip 102.

As aforementioned, in the embodiment of the present disclosure, in order to suppress a height difference between areas of final bumps caused due to a height difference in an underlying layer when viewed on a cross-section, a seed layer of areas where main bumps are to be formed and a seed layer of areas where support bumps are to be formed are separated from each other before a plating process, and plating amounts by areas are differentiated by applying different current densities and/or plating times in the plating process. As a consequence, the final height difference between the main bumps and the support bumps may be removed.

Accordingly, in the case of forming bumps according to the embodiment of the present disclosure, it is possible to suppress a height difference between final bumps by areas that is otherwise likely to occur due to a height difference in an underlying layer when viewed on a cross-section. Therefore, the main bumps of a semiconductor chip may be bonded reliably with bond fingers of a printed circuit board regardless of the height difference in the underlying layer on which the main bumps and supports bumps are formed, when flip-chip bonding the semiconductor chip to the printed circuit board. Also, leaning of the semiconductor chip may be prevented, and as a result, the yield and reliability of a packing process may be improved.

Figure 8A:
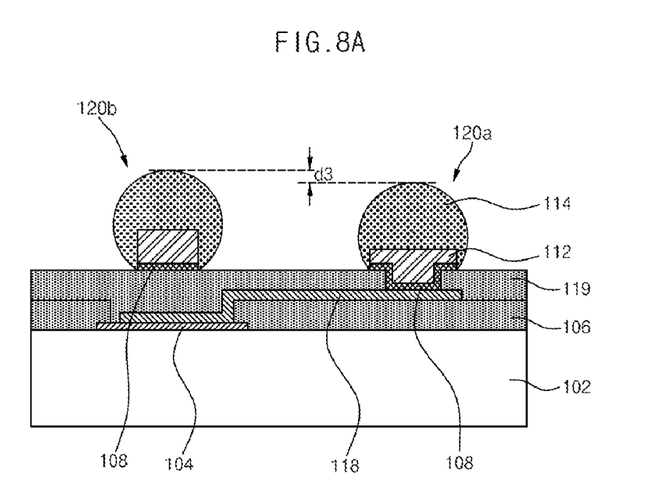
FIGS. 8A and 8B are representations of examples of cross-sectional views to assist in the explanation of a method for forming bumps of a semiconductor package in accordance with another embodiment of the present invention.
Figure 8B:
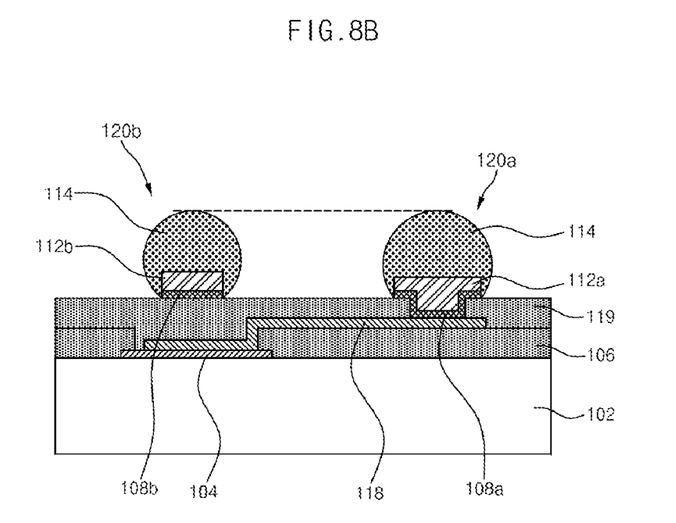

FIGS. 8A and 8B are representations of examples of cross-sectional views to assist in the explanation of a method for forming bumps of a semiconductor package in accordance with another embodiment. The present embodiment illustrates a method for forming bumps of a semiconductor chip formed with redistribution lines. Repeated descriptions for the same parts as the previous embodiment will be omitted herein, and the same reference numerals will be used to refer to the same components.

As shown in FIG. 8A, a semiconductor chip 102 may include an electrode pad 104 which is disposed on the top surface thereof, a first insulation layer 106 which is formed on the top surface in such a way as to expose the electrode pad 104, a redistribution line 118 which is formed on the electrode pad 104 and the first insulation layer 106, and a second insulation layer 119 which is formed on the redistribution line 118 and the first insulation layer 106 in such a way as to expose the end of the redistribution line 118, that is, a rearrangement pad.

In this way, as the redistribution line 118 is formed, a height difference d3 may be caused between a main bump 120a formed on the rearrangement pad of the redistribution line 118 and a support bump 120b formed on the second insulation layer 119. For example, in the semiconductor chip 102 having the redistribution line 118, the height of the main bump 120a may be lower than the height of the support bump 120b.

Thus, in the case where the semiconductor chip 102 in which a difference is caused between the final heights of the main bump 120a and the support bump 120b in this way is flip-chip bonded to a printed circuit board, while not shown, as the main bump 120a is not brought appropriately into contact with a bond finger of the printed circuit board, stable flip-chip bonding of the semiconductor chip 102 may not be implemented.

In consideration of this, as shown in FIG. 8B, in the present embodiment, when performing electroplating, by differentiating current densities by the voltages applied to a first seed layer pattern 108a of a main bump forming area and a second seed layer pattern 108b of a support bump forming area or plating times, for example, the plating thickness, that is, plating height, of a second copper pillar 112b included in the support bump 120b is controlled to be lower than the plating height of a first copper pillar 112a included in the main bump 120a, and through this, the final heights of the main bump 120a and the support bump 120b are made the same as or similar to each other.

Also, to this end, in the present embodiment, similar to the above-described embodiment, a portion of a seed layer of an area where a main bump is to be formed and a portion of the seed layer of an area where a support bump is to be formed are separated from each other. In this state, different voltages are applied to the seed layer patterns of the respective areas or different plating times are applied to the seed layer patterns of the respective areas while applying the same voltage.

In a manner similar to the above-described embodiment, the semiconductor chip 102 of the present embodiment may include all kinds of semiconductor chips, for example, a memory chip, a logic chip, a DDI (display driver IC) and a CMOS image sensor chip.

While a metal layer constructed by the stack structure of a copper pillar and a solder is adopted as the material of a main bump and a support bump in the above-described embodiments, it is to be noted that other materials may be used.

Meantime, while the above-described embodiments illustrate and exemplify a semiconductor chip as an underlying layer having a height difference when viewed on a cross-section, in another embodiment, an underlying layer having a height difference when viewed on a cross-section may include an interposer.

The interposer may be understood as a connection medium which is interposed between semiconductor chips or between packages or interposed between a system board and a package, to realize a stack package in the semiconductor package field. While not shown, the interposer may include an insulation layer, electrode pads which are formed at the center portion of the top surface of the insulation layer, and an insulation film which is formed on the insulation layer in such a way as to expose the electrode pads. Also, the interposer may include a plurality of vias which pass therethrough and are electrically connected with the electrode pads.

Even in this embodiment, in an interposer, portions of a seed layer where main bumps are to be formed and portions of the seed layer where support bumps are to be formed are separated from each other before performing a plating process, and, in this state, electroplating is performed by applying different current densities and/or plating times by areas. As a consequence, the final heights of the main bumps and the support bumps in the interposer may be kept uniform.

While various embodiments have been described above, it will be understood to those skilled in the art that the embodiments described are by way of example only. Accordingly, the method for forming bumps in a semiconductor package described herein should not be limited based on the described embodiments.

What is claimed is:

1. A method for forming bumps of a semiconductor package to suppress a final height difference between main bumps and support bumps that is caused by a height difference between areas of an underlying layer when viewed on a cross-section, the method comprising:
    forming first seed layer patterns and second seed layer patterns which are disposed in the areas and are electrically separated from each other, over the underlying layer having the height difference; and
    forming the main bumps and the support bumps by an electroplating process using the first seed layer patterns and the second seed layer patterns as electrodes,
    wherein the electroplating process is performed under a condition that a voltage applied to the first seed layer patterns and a voltage applied to the second seed layer patterns are different from each other so that upper ends of the main bumps and upper ends of the support bumps are located at the same level.

2. The method according to claim 1, wherein the underlying layer includes a semiconductor chip which has electrode pads disposed at a center portion of a top surface thereof and an insulation layer formed over the top surface in such a way as to expose the electrode pads.

3. The method according to claim 1, wherein the underlying layer includes a semiconductor chip which has electrode pads disposed over a top surface thereof, a first insulation layer formed over the top surface in such a way as to expose the electrode pads, redistribution lines formed over the electrode pads and the first insulation layer and a second insulation layer formed over the first insulation layer in such a way as to expose ends of the redistribution lines.

4. The method according to claim 1, wherein the underlying layer includes an interposer which has electrode pads disposed at a center portion of a top surface thereof and an insulation layer formed over the top surface in such a way as to expose the electrode pads.

5. The method according to claim 1, wherein the forming of the first seed layer patterns and the second seed layer patterns comprises:
    forming a seed layer over the underlying layer having the height difference;
    forming, over the seed layer, a photoresist pattern which exposes main bump forming areas, portions of the seed layer therebetween, support bump forming areas and portions of the seed layer therebetween;
    etching the seed layer by using the photoresist pattern as an etch mask; and
    removing the photoresist pattern.

6. The method according to claim 1, wherein the forming of the first seed layer patterns and the second seed layer patterns comprises:
    disposing, over the underlying layer having the height difference, a shadow metal mask having a structure which exposes main bump forming areas, portions therebetween, support bump forming areas and portions therebetween;
    depositing selectively a seed layer over the exposed areas of the underlying layer by using the shadow metal mask as a deposition mask; and
    removing the shadow metal mask.

7. The method according to claim 1, wherein the first seed layer patterns and the second seed layer patterns are formed in the shapes of lines which extend in a vertical direction and are alternately disposed in a horizontal direction or extend in the horizontal direction and are alternately disposed in the vertical direction and in which ends of the lines are connected with one another.

8. The method according to claim 1, wherein the first seed layer patterns are formed in the shapes of lines each of which extends in a horizontal direction and includes, at intermediate portions thereof, branch portions extending in a vertical direction, and the second seed layer patterns are formed in the shapes of plates which surround the first seed layer patterns.

9. The method according to claim 1, wherein the forming of the main bumps and the support bumps is performed under a condition that a magnitude of the voltage applied to the first seed layer patterns and a magnitude of the voltage applied to the second seed layer patterns are different from each other.

10. The method according to claim 9, wherein the forming of the main bumps and the support bumps is performed in such a way as to sequentially form copper pillars and a solder through electroplating.

11. The method according to claim 10, wherein the electroplating is performed in such a way as to control a plating thickness of at least one of the copper pillars and the solder.

12. The method according to claim 2, wherein the semiconductor chip includes any one among a memory chip, a logic chip, a DDI (display driver IC) and a CMOS image sensor chip.

13. The method according to claim 1, wherein the forming of the main bumps and the support bumps is performed under a condition that a voltage application time length to the first seed layer pattern and a voltage application time length to the second seed layer pattern are different from each other.

* * * * *